United States Patent [19]

Schweitzer, Jr.

[11] 4,375,617

[45] Mar. 1, 1983

[54] FAULT INDICATOR WITH FLUX CONCENTRATING MEANS

[76] Inventor: Edmund O. Schweitzer, Jr., 1002 Dundee Rd., Northbrook, Ill. 60062

[21] Appl. No.: 132,141

[22] Filed: Mar. 20, 1980

[51] Int. Cl.³ .................. G01R 31/02; G01R 19/14; G01R 15/10

[52] U.S. Cl. .................................. 324/133; 324/51; 324/115; 324/127; 340/664

[58] Field of Search ............ 324/133, 127, 117 R, 324/102, 51, 115; 340/659, 664

[56] References Cited

U.S. PATENT DOCUMENTS

| | | | |
|---|---|---|---|
| 3,518,544 | 6/1970 | Tachick | 324/133 |
| 3,528,009 | 9/1970 | Astrove | 324/133 |
| 3,600,293 | 8/1971 | Hyduh et al. | 324/133 |
| 3,816,816 | 6/1974 | Schweitzer, Jr. | 340/664 |
| 3,906,477 | 9/1975 | Schweitzer, Jr. | 324/133 |
| 4,086,529 | 4/1978 | Schweitzer, Jr. | 324/127 |

Primary Examiner—Gerard R. Strecker
Assistant Examiner—Walter E. Snow
Attorney, Agent, or Firm—Lockwood, Dewey, Alex & Cummings

[57] ABSTRACT

A fault indicator for indicating the occurrence of a fault current in an electrical conductor includes an externally viewable target which is positioned to a fault-indicating position by a trip circuit within the indicator upon occurrence of a fault current. The trip circuit is responsive to a magnetic field within a predetermined sensing plane generally parallel to the conductor. To increase the sensitivity of the indicator to the magnetic field of the conductor, the fault indicator includes flux concentrating pole pieces which form a low reluctance magnetic circuit between the circumference of the conductor and the sensing plane.

6 Claims, 17 Drawing Figures

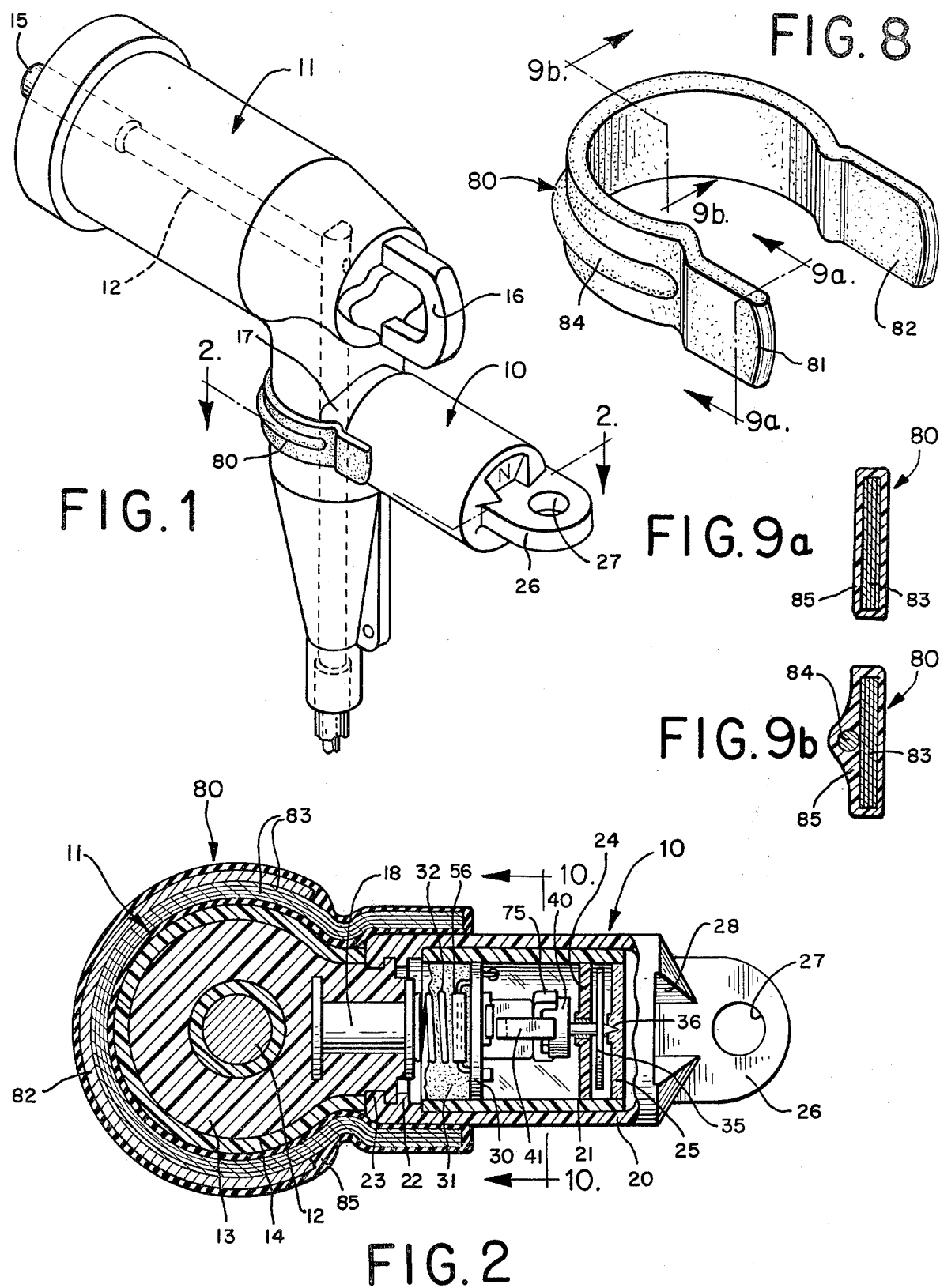

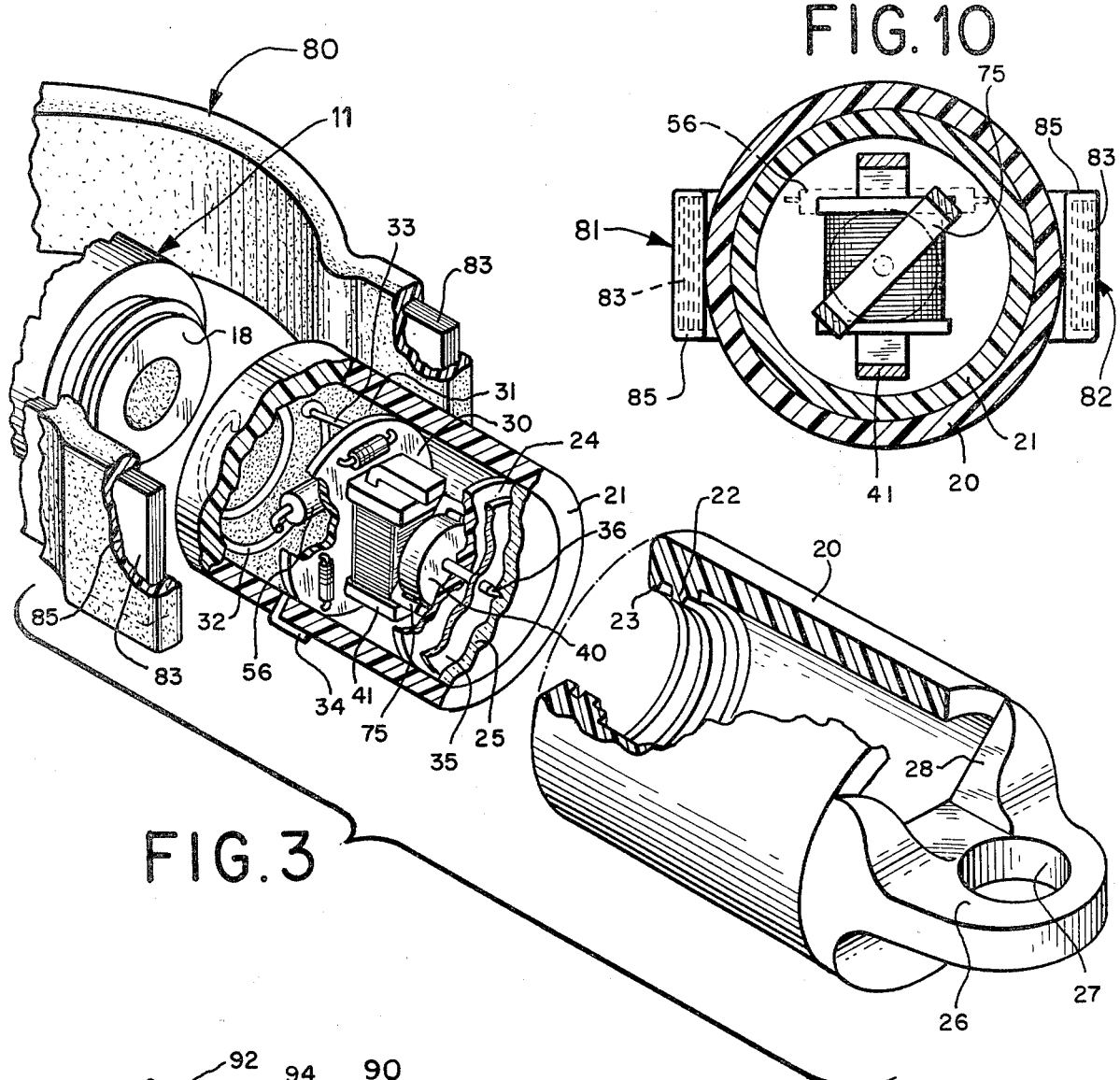
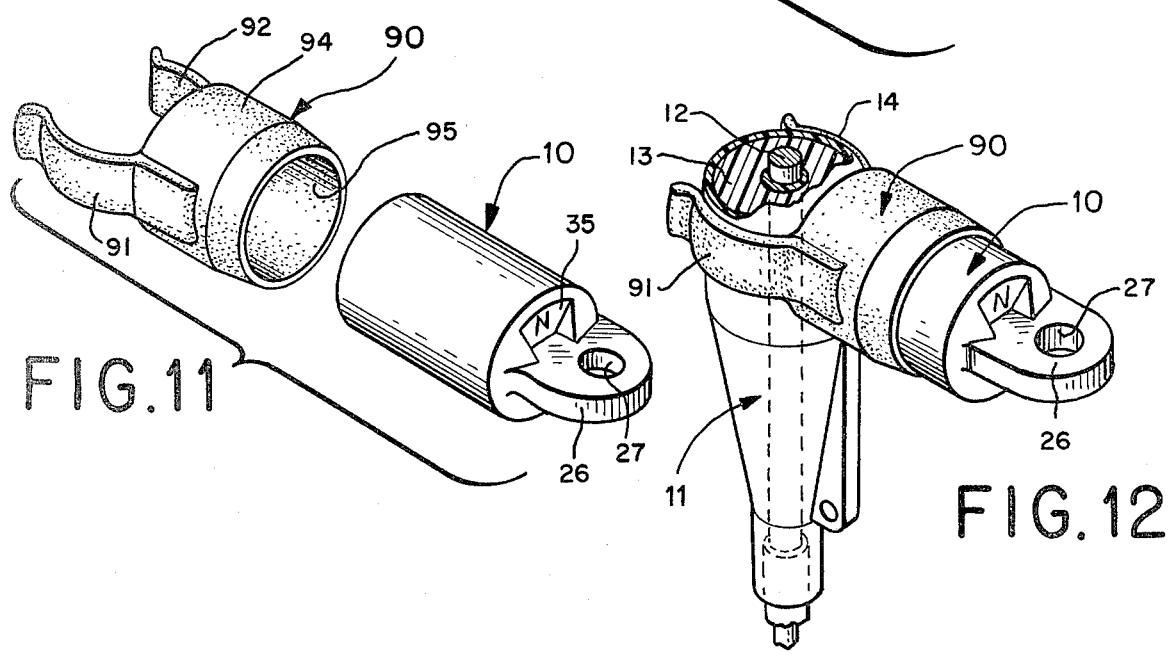

FAULT INDICATOR WITH FLUX CONCENTRATING MEANS

BACKGROUND OF THE INVENTION

The present invention relates generally to current sensing devices for electrical systems, and more particularly to fault indicators for installation on electrical conductors which include means for concentrating the flux from the conductor to a predetermined sensing plane.

Various types of fault indicators have been constructed for detecting faults in electrical distribution systems, including clamp-on type fault indicators, which clamp directly over cables in the system, and test-point type fault indicators, which are mounted over test points in the cables or associated connectors. Such fault indicators may be either of the manually reset type, wherein it is necessary that the indicator be physically reset following each fault, or of the automatically reset type, wherein a fault indication is reset upon restoration of line current. Examples of such fault indicators are found in products manufactured by E. O. Schweitzer Mfg. Co. of Mundelien, Illinois, and in U.S. Pat. Nos. 3,676,740, 3,906,477, and 4,063,171 of the present inventor.

Detection of fault currents by self-resetting fault indicators is often most advantageously accomplished by means of a reed switch located within the indicator housing having contacts in close proximity to the conductor being monitored. Upon occurrence of an abnormally high fault-associated magnetic field around the conductor, the contacts close and actuate circuitry which magnetizes an internal pole piece to position to a trip position a target indicator visible from the exterior of the indicator. Upon restoration of current in the conductor another circuit may be actuated to reposition the target indicator to a reset non-fault indicating position.

The present invention is directed to improvements in fault indicators which provide for more reliable operation and improved sensitivity. Specifically, the present invention provides magnetic flux concentrating means in the form of magnetic pole pieces which form a low reluctance magnetic circuit between the circumference of the conductor, wherein the magnetic field of the conductor is concentrated, and the magnetic sensing plane of the indicator, within which the reed switch responds to an applied magnetic field.

Accordingly, it is a general object of the present invention to provide a new and improved fault indicator.

It is more specific object of the present invention to provide a new and improved fault indicator having improved reliability and sensitivity.

SUMMARY OF THE INVENTION

The invention is directed to a fault indicator for indicating the occurrence of a fault current in an electrical conductor. The indicator includes a housing adapted for mounting in proximity to the conductor, and status indicating means having a reset-indicating state and a fault-indicating state. Fault detecting means responsive to an applied magnetic field within a predetermined magnetic sensing field are provided for actuating the status indicating means to the fault indicating means. Magnetic flux concentrating means extending between the circumference of the conductor and the sensing plane form a low reluctance circuit between the conductor and the indicator to increase the sensitivity of the indicator.

BRIEF DESCRIPTION OF THE DRAWINGS

The features of the present invention, which are believed to be novel, are set forth with particularity in the appended claims. The invention, together with the further advantages thereof, can best be understood by reference to the following description taken in conjunction with the accompanying drawings, in the several figures in which like reference numerals identify like elements, and in which:

FIG. 1 is a perspective view, illustrating a test-point mounted fault indicator incorporating the present invention mounted on the test-point terminal of a plug-in elbow connector.

FIG. 2 is an enlarged cross-sectional view of the fault indicator and connector taken along line 2—2 of FIG. 1.

FIG. 3 is a fragmentary perspective view of the fault indicator in a partially disassembled state;

FIGS. 6a and 6b are diagrammatic views similar to FIGS. 4a and 4b, respectively, showing the principal components of the fault indicator in a tripped state.

FIG. 8 is an enlarged perspective view of the flux concentrating collar of the fault indicator.

FIG. 9a is a cross-sectional view of the flux concentrating collar taken along line 9a—9a of FIG. 8.

FIG. 9b is a cross-sectional view of the flux concentrating collar taken along line 9b—9b of FIG. 8.

FIG. 10 is an enlarged cross-sectional view of the fault indicator taken along line 10—10 of FIG. 1.

FIG. 11 is an exploded perspective view of a fault indicator incorporating an alternative embodiment of the invention.

FIG. 12 is a fractional perspective view of partially in section of the fault indicator of FIG. 11 mounted on an elbow connector.

DESCRIPTION OF THE PREFERRED EMBODIMENT

Figure 4A:
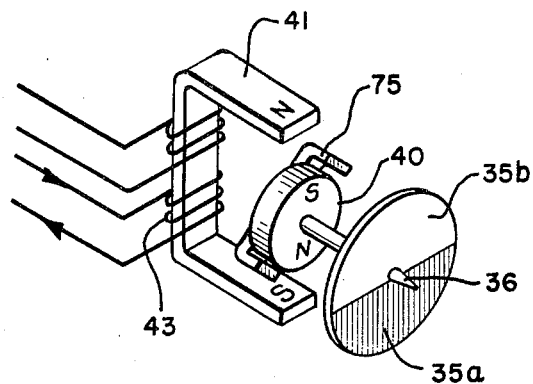
FIGS. 4a and 4b are diagrammatic views of the principal components of the fault indicator in a reset state.

Referring to the drawings, and particularly to FIGS. 1-4, a fault indicator 10 incorporating the invention is shown in conjunction with a conventional plug-in elbow connector 11 of the type commonly used in high voltage alternating current systems for establishing plug-in connections to transformers or other devices (not shown). As shown in FIG. 2, the connector 11 includes generally an axial conductor 12 extending through an insulating jacket 13 encased in an electrically-conductive sheath 14, the sheath being grounded in accordance with conventional practice. A plug-in receptacle 15 extends from conductor 12 and is arranged to connect with a complimentary contact on the transformer or device. An arcuate member 16 having ends anchored in the conductive sheath 14 extends from the connector to receive the hook end of a lineman's tool to facilitate removal of the connector from the transformer or other device.

In accordance with conventional practice, connector 11 includes a test-point terminal 17 which comprises a projection of the insulating jacket 13 and an electrical contact 18 embedded in the end thereof.

Referring to FIGS. 2 and 3, the fault indicator 10 comprises an electrically conductive hollow rubber outer shell 20 which is open at one end for mounting to the test-point terminal 17. A correspondingly sized cylindrical transparent plastic housing 21 containing the electrical components of the voltage indicator circuit is contained within the rubber outer shell, and held in position within the shell by an annular flange 22 on the inside surface of the shell. The annular flange also forms a rim portion 23 which secures the shell over the test-point. The cylindrical housing 21 includes an integral partition 24 which serves as a mask and spacing element, and a transparent end cap portion 25 sonically welded to the end of the housing.

When fault indicator 10 is installed on test-point terminal 17 the outer surface of flange 23 engages the electrically conductive connector sheath 13 to establish an electrical ground for shell 20. At the closed end of the shell a tab portion 26 having an aperture 27 is provided to facilitate the removal of the test-point cap with a conventional hooked lineman's tool. A window 28 in the end of the outer shell allows the end housing 21 to be viewed.

As seen in FIGS. 2 and 3, a disc-shaped insulator board 30 is positioned perpendicular to the axis of housing 21 in a location intermediate the ends thereof. The insulator board, which may be secured in position by an epoxy material 31 filling the housing, serves as mounting means for the electrical components of the fault indicator circuitry. An electrical connection is established between this circuitry and test-point 18 by means of a helical spring 32, the spring being connected to a wire conductor 33 extending from the circuit board at one end, and being resiliently pressed against contact 18 at its other end. An electrical ground connection is established to the circuit board by means of an additional electrical conductor 34 wedged between housing 21 and the electrically conductive grounded outer shell 20.

To provide an indication of the occurrence of a fault current in conductor 12, the fault indicator includes within the lower end of housing 21 a disc-shaped target 35 which is mounted for rotation on a pivot 36. The face of the target disc has a red segment 35a (FIGS. 4–6) and a white segment 35b, only one of which is visible at a time through window 28 and the transparent end of housing 21.

Figure 4B:
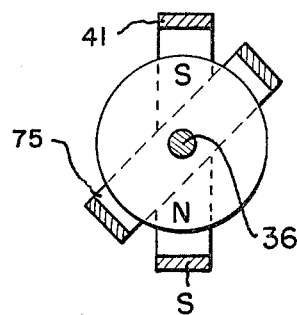
Figure 5A:
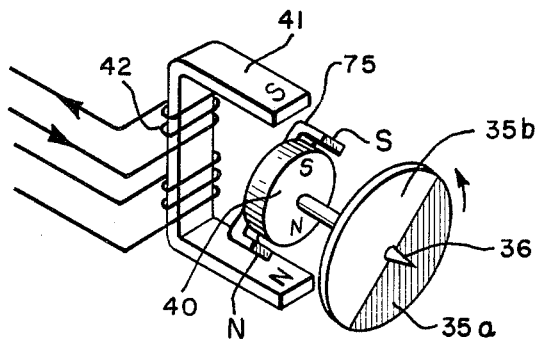
FIGS. 5a and 5b are diagrammatic views similar to FIGS. 4a and 4b, respectively, showing the principal components of the fault indicator in transition between a reset state and a tripped state.
Figure 5B:
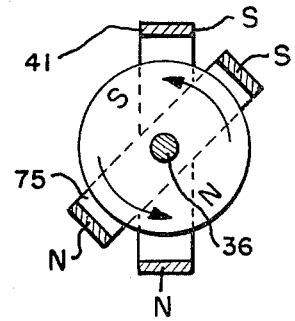
Figure 6A:
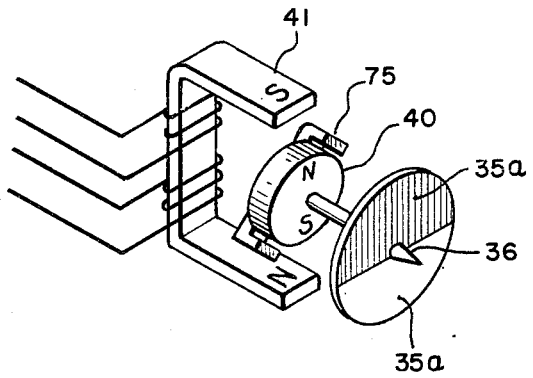
Figure 6A:
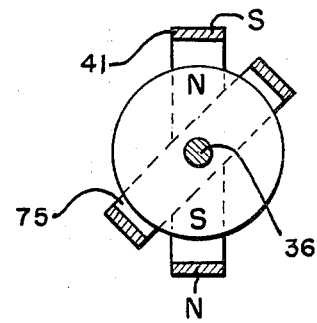

Secured to and pivotal with target 35 is a target permanent magnet 40 which is formed of a magnetic material having a high coercive force, such as ceramic, and is magnetically polarized to form two magnetic poles of opposite gender, as indicated in FIGS. 4–6, with opposite magnetic polarities along a diameter of the magnet. The target disc 35 and its permanent magnet 40 are biased to the position shown in FIGS. 4a and 4b when the fault indicator is in a non-tripped or reset condition by means of a stationary U-shaped magnetic pole piece 41, which is preferably formed of a magnetic material having a relatively low coercive force, such as a chrome steel.

When the fault indicator is in a reset state, the projecting ends of the pole piece are biased to the magnetic polarities indicated in FIGS. 4a and 4b. As a result, the opposite polarity magnetic poles of the target magnet 40 are attracted to position the target disc 35 as shown. In this position the red segment 35a of the target disc is not visible through window 28, and all that is seen is the white segment 35b.

On the occurrence of a fault current in conductor 12, which may, for example, exceed 400 amperes, pole piece 41 is remagnetized to the magnetic polarities shown in FIGS. 5 and 6 by momentary energization of a trip winding 42 on the center section of the pole piece. As a result, the poles of magnet 40 are repelled by the adjacent like gender poles of the pole piece and the target disc is caused to rotate 180° to the tripped position shown in FIGS. 6a and 6b. In this position, the red segment 35a of the target disc is visible through window 28, and a lineman viewing the fault indicator is advised that a fault current has flowed through conductor 12.

The target disc remains in the fault indicating position until the ends of pole piece 41 are subsequently re-magnetized to the magnetic polarities shown in FIGS. 4a and 4b by momentary energization of a reset winding 43 on the center section of the pole piece. As a result, the target magnet 40, and hence the target disc 35, are caused to rotate from the tripped position shown in FIGS. 6 to the reset position shown in FIGS. 4, and the fault indicator is conditioned to respond to a subsequent fault current.

Figure 7:
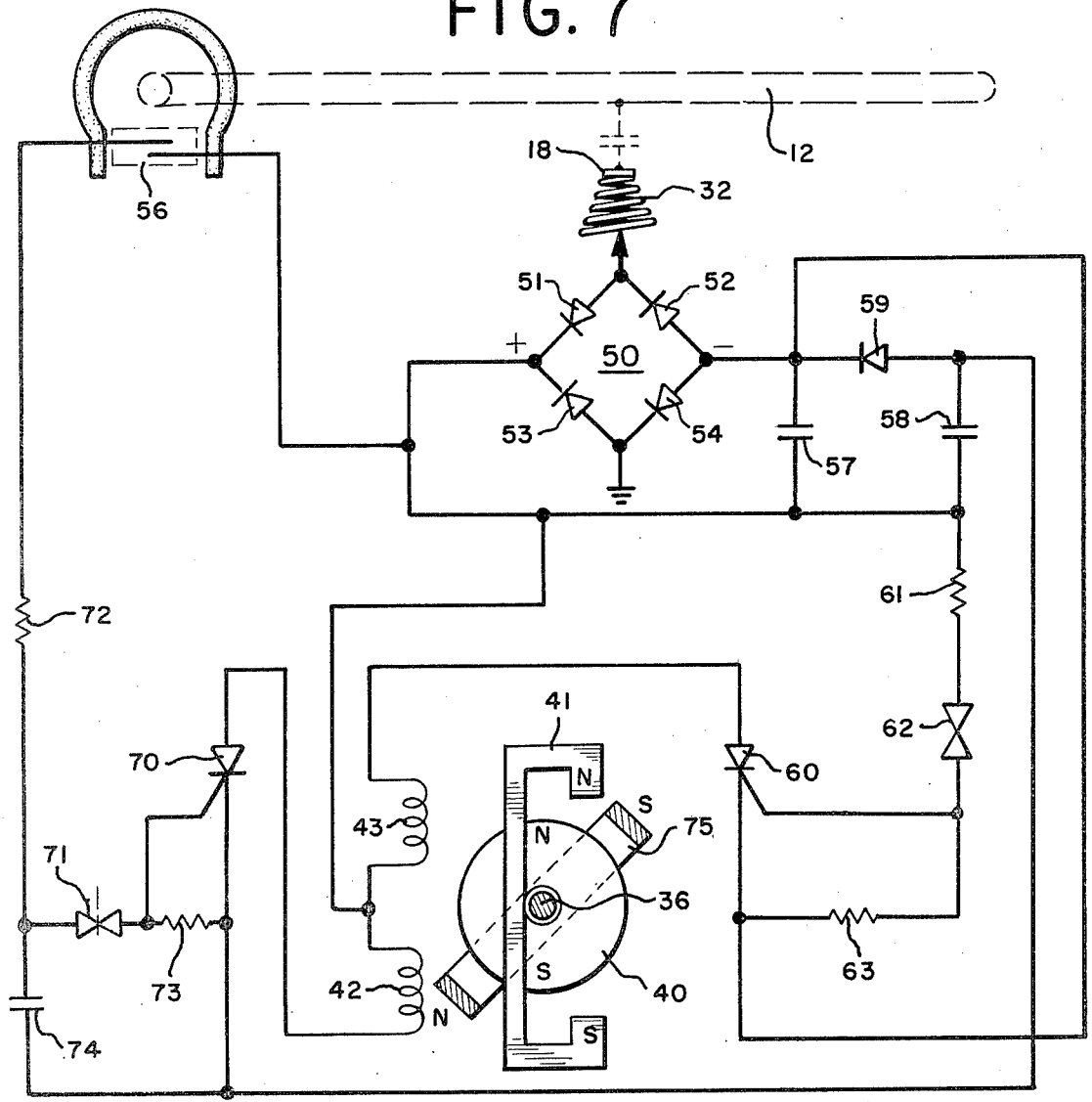
FIG. 7 is an electrical schematic diagram of the fault indicator.

Energization of winding 42 upon occurrence of a fault current in conductor 12, and energization of winding 43 upon restoration of current in conductor 12 following a fault, is accomplished by means of circuitry contained within the fault indicator. Referring to the schematic diagram shown in FIG. 7, windings 42 and 43 are connected to end-to-end for independent energization upon occurrence of fault and reset conditions, respectively. Operating power for these windings is obtained by means of a bridge rectifier network 50, consisting of diodes 51–54. One input terminal of this network, formed at the juncture of the anode of diode 51 and the cathode of diode 52, is connected through the helical spring 32 to test-point contact 18. The other input terminal, formed at the juncture of the anode of diode 53 and the cathode of diode 54, is connected to ground through the electrically conductive sheath 20 of the fault indicator. With this arrangement, high voltage alternating current carried in conductor 12 is capacitively coupled to the bridge rectifier network, resulting in the production of a pulsating unidirectional current at the output terminals of the network.

The positive polarity output terminal of the bridge rectifier network, formed at the cathodes of diodes 51 and 53, is connected to one contact of a reed switch 56, to the end terminals of windings 42 and 43, and to respective terminals of capacitors 57 and 58. The negative polarity output terminal of the bridge rectifier network, formed at the juncture of the anodes of diodes 52 and 54, is connected directly to the remaining terminal of capacitor 57, and through a forward-biased diode 59 to the remaining terminal of capacitor 58. With this arrangement, capacitors 57 and 58 are charged by the pulsating unidirectional current developed by bridge rectifier network 50 during normal current flow in conductor 12.

To provide for periodic energization of reset winding 43 during normal current flow-in conductor 11, the remaining end terminal of winding 43 is connected through a silicon controlled rectifier (SCR) 60 to the negative polarity terminal of capacitor 57. Periodic conduction through SCR 60 is obtained by connecting the gate electrode of that device to the positive polarity output terminal of bridge rectifier network 50 through a resistor 61 and a bilateral diode 62, and to the cathode of SCR 60 by a resistor 63. With this arrangement, SCR 60 is periodically triggered into conduction when the voltage developed across bilateral diode 62 as a result of capacitor 57 being charged by bridge rectifier 50 reaches the threshold level of the bilateral diode.

In operation, under normal current flow conditions, the voltage developed across capacitor 57 as the capacitor is charged by bridge rectifier network 50 progressively increases with time, until the threshold breakdown voltage of bilateral diode 62 is reached, at which time SCR 60 is triggered and capacitor 57 discharges through winding 43. Diode 59 prevents capacitor 58 from being discharged through SCR 60 and winding 43, leaving the capacitor available for energizing winding 42 in response to a fault condition. In practice, the breakdown voltage of bilateral diode 62 may be in the order of 34 volts, and the time required for capacitor 58 to reach this threshold level with a voltage level of 4,400 volts on conductor 12 may be approximately 2 minutes. In any case, the voltage level within conductor 12 is not critical to the operation of the reset circuit, and has only the effect of changing the frequency of the reset cycle.

Trip winding 42 is energized upon occurrence of a fault current in conductor 12 by discharge of capacitor 58 through a second silicon controlled rectifier 70. Conduction is established through SCR 70 by closure of the contacts of reed switch 56, which is positioned within housing 21 in close proximity to conductor 12. The gate electrode of SCR 70 is connected through a bilateral diode 71 and a resistor 72 to the contacts of reed switch 56, and by a resistor 73 to the SCR cathode. The juncture of resistor and bilateral diode 71 is connected by a capacitor 74 to capacitor 58.

Upon occurrence of a fault current in conductor 12, the positive polarity output terminal of bridge rectifier network 50 is connected through the closed contacts of reed switch 56 and the circuit comprising resistor 72, bilateral diode 71 resistor 73 and capacitor 74 to the gate electrode of SCR 70, causing that device to be rendered conductive following a predetermined time delay. At this time capacitors 57 and 58 are caused to discharge through SCR 70 and energize winding 42. The resulting magnetic flux in the U-shaped pole piece 41 reverses the magnetic pole polarities of the pole piece and causes rotation of the target as previously described.

To avoid the possibility of rotor 35 becoming stalled upon reversal of the magnetic polarities of pole piece 41, as might happen with a rotor being perfectly centered between the poles of pole pieces 41 and having a degree of bearing friction, the fault indicator includes an auxiliary U-shaped pole piece 80 positioned adjacent target magnet 40 coaxial with and at an angle to pole piece 41.

The existence of a magnetic field between the poles of pole piece 41 results in the production of induced magnetic poles on auxiliary pole piece 80 of opposite gender to the most adjacent poles of pole piece 41. This is illustrated in FIGS. 4-6, and results by reason of the auxiliary pole piece 80 becoming included in the magnetic flux path between the poles of pole piece 41. The effect of the induced magnetic poles is that upon reversal of the gender of the poles of pole piece 50 following occurrence of a fault current the auxiliary poles exert a rotational force on the most adjacent poles of the permanent rotor magnet 40 associated with target 35. This results in a rotational moment being exerted on the target, tending to turn the target in a predetermined (counter-clockwose in FIGS. 4-6) direction such that the target is precluded from remaining in its reset position, even if it should be perfectly positioned and have a degree of bearing friction. Once rotation has been established, as shown in FIG. 5 the greater force of the main pole piece 41 over-comes the effect of the auxiliary pole piece 80 and rotation continues until the target is aligned as shown in FIG. 6.

In accordance with the invention, fault indicator 10 is provided with magnetic flux concentrating means in the form of a snap-on pole piece 80. Referring to FIG. 8, the pole piece is in the form of a generally U-shaped collar having a central curved portion substantially corresponding to the exterior of elbow connector 11, and first and second projecting end portions 81 and 82 parallel-spaced to extend along opposite sides of shell 20 when the fault indicator is installed on the test point of the connector. This has the effect of concentrating the magnetic field generated around conductor 12 as a result of current flow in the conductor within the relatively narrow gap between the projecting end portions. Since reed switch 56 is positioned in this gap when the fault detector is installed, as in FIG. 2, and is most responsive to an applied magnetic flux in a plane common to the switch and perpendicular to the axis of the fault indicator, a greater portion of the magnetic flux around conductor 12 is caused to act on the reed switch, and the fault indicator is rendered more sensitive to current level in conductor than it would be without pole piece 80.

In practice, installation of pole piece 80 typically reduces the current required in a monitored conductor for a fault indication by a ratio of four to one, or from 800 amperes to 200 amperes, or from 300 amperes to 75 amperes in representative installations.

Referring to FIGS. 8-10, pole piece 80 may be formed from a plurality of individual thin silicon steel laminations 83 formed as shown to obtain the desired shape and joined together to provide a low reluctance path for the magnetic field generated around conductor 12. A tension reinforcing spring 84 of heavy spring wire may be provided to bias the stacked laminations into engagement with elbow connector 11 and housing 20. The resulting assembly is preferably covered with a layer 85 of vinyl material.

Figure 13:
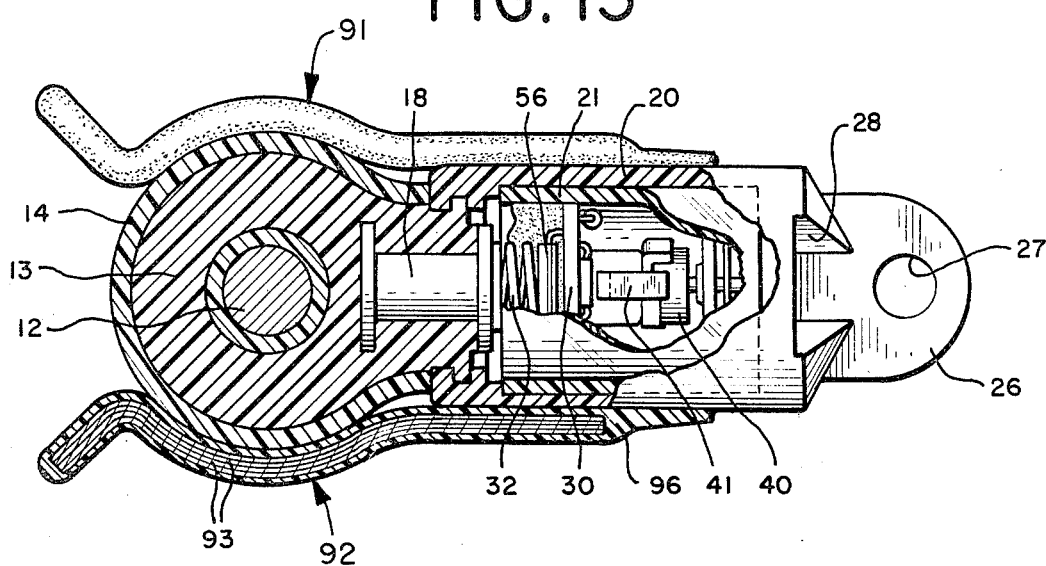
FIG. 13 is an enlarged cross-sectional view of the alternate form of fault indicator taken along line 13—13 of FIG. 12.

An alternate embodiment 90 of flux concentrating means in accordance with the invention is shown in FIGS. 11-13. In this embodiment two parallel-spaced pole pieces 91 and 92 are provided on opposite sides of the conductor. The pole pieces, which are formed from a plurality of closely spaced silicon steel laminations 93, each include generally C-shaped portions which engage respective portions of the circumference of the conductor insulation layer, and projecting parallel-spaced pole portions which extend along respective sides of the fault indicator housing. The pole portions are joined by a cylindrical body portion 94 (FIG. 11) preferably formed of a vinyl or rubber material and having a recess 95 within which the housing 20 of the fault indicator is snugly received, as shown in FIG. 12. A layer 96 of vinyl material is preferably formed over pole pieces 91 and 92 to bind laminations 93 together and provide a smooth outer surface.

In operation, the magnetic flux generated as a result of current flow in conductor 12 is directed to the gap between the pole portions of the pole pieces, thereby increasing the sensitivity of reed switch 56 to fault currents. As in the previously described embodiment, a sensitivity increase of 4 to 1 is typical.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. In a fault indicator for mounting on the test point terminal of an electrical connector employed in a high-voltage system, wherein the connector includes a conductor embedded in an insulating layer, and wherein the test point terminal comprises a radially projecting portion of the insulating layer and an electrically conductive test point contact embedded in the projecting portion, the test point contact having an exposed portion at the outer end of the test point terminal, alternating current in the conductor capacitively inducing a proportional alternating current at the test point contact for powering the indicator, and of the type having a hollow elongated cylinder shell having an open end adapted to engage the projecting insulation layer of the test point terminal, and trip circuit means within said shell responsive to the alternating current at the test point terminal for providing an output indication upon the occurrence of a fault current in the conductor, said trip circuit means including magnetic sensing means which actuate in response to the magnetic field of a current at or above a first predetermined level in the conductor, the improvement comprising:

magnetic flux concentrating means comprising a pair of magnetic pole pieces, each extending at one end around, and being resiliently biased toward the other pole piece, to engage a portion of the circumference of the insulating layer, in a plane generally perpendicular to the conductor, and at the other end in parallel-spaced relationship in the direction of the projecting portion of the test point terminal to the magnetic sensing means; and said magnetic flux concentrating means further comprising a cylindrical non-magnetic sleeve extending between said projecting portions of said pole pieces in coaxial engagement with said shell, said sleeve portion having an inside diameter generally corresponding to the outside diameter of said shell, whereby said sleeve and said pole pieces are fixedly positioned relative to said shell and said magnetic sensing means, for concentrating the magnetic field developed at said magnetic sensing means by current in the conductor whereby said magnetic sensing means actuate in response to current in the conductor at or above a second predetermined level lower than said first predetermined level.

2. A fault indicator as defined in claim 1 wherein the magnetic sensing means and said projecting ends of said pole pieces lie in a plane generally perpendicular to the axis of the projecting insulating layer of the test point terminal.

3. A fault indicator for mounting on the test point terminal of an electrical connector employed in a high-voltage system, wherein the connector includes a conductor embedded in an insulating layer, and wherein the test point terminal comprises a radially projecting portion of the insulating layer and an electrically conductive test point contact embedded in the projecting portion, the test point contact having an exposed portion at the outer end of the test point terminal, alternating current in the conductor capacitively inducing a proportional alternating current at the test point contact for powering the indicator, said fault indicator comprising, in combination:

a hollow elongated cylindrical shell having an open end adapted to engage the projecting insulation layer of the test point terminal;

trip circuit means within said shell responsive to the alternating current at the test point terminal for providing an output indication upon the occurrence of a fault current in the conductor, said trip circuit means including magnetic sensing means which actuate in response to the magnetic field of a current at or above a first predetermined level in the conductor;

magnetic flux concentrating means comprising a pair of magnetic pole pieces, each extending at one end around, and being resiliently biased toward the other pole piece, to engage a portion of the circumference of the insulating layer, in a plane generally perpendicular to the conductor, and at the other end in parallel-spaced relationship in the direction of the projecting portion of the test point terminal to the magnetic sensing means; and said magnetic flux concentrating means further comprising a cylindrical non-magnetic sleeve extending between said projecting portions of said pole pieces in coaxial engagement with said shell, said sleeve portion having an inside diameter generally corresponding to the outside diameter of said shell, whereby said sleeve and said pole pieces are fixedly positioned relative to said shell and said magnetic sensing means, for concentrating the magnetic field developed at said magnetic sensing means by current in the conductor whereby said magnetic sensing means actuate in response to current in the conductor at or about a second predetermined level lower than said first predetermined level.

4. A fault indicator as defined in claim 3 wherein the magnetic sensing means and said projecting ends of said pole pieces lie in a plane generally perpendicular to the axis of the projecting insulating layer of the test point terminal.

5. A magnetic flux concentrating attachment for use in conjunction with a fault indicator for mounting on the test point terminal of an electrical connector employed in a high voltage system, wherein the connector includes a conductor embedded in an insulating layer, and wherein the test point terminal comprises a radially projecting portion of the insulating layer and an electrically conductive test point contact embedded in the projecting portion, the test point contact having an exposed portion at the outer end of the test point terminal, alternating current in the conductor capacitively inducing a proportional alternating current at the test point contact for powering the indicator, and including a hollow elongated cylindrical shell having an open end adapted to engage the projecting insulation layer of the test point terminal, and trip circuit means within said shell responsive to the alternating current at the test point terminal for providing an output indication upon the occurrence of a fault current in the conductor, said trip circuit means including magnetic sensing means which actuate in response to the magnetic field of a current at or above a first predetermined level in the conductor;

said magnetic flux concentrating attachment comprising:

magnetic flux concentrating means including a pair of magnetic pole pieces, each extending at one end around, and being resiliently biased toward the other pole piece, to engage a portion of the circumference of the insulating layer, in a plane generally perpendicular to the conductor, and at the other end in parallel-spaced relationship in the direction of the projecting portion of the test point terminal to the magnetic sensing means; and means comprising a cylindrical non-magnetic sleeve extending between said projecting portions of said pole pieces in coaxial engagement with said shell, said sleeve portion having an inside diameter generally corresponding to the outside diameter of said shell whereby said sleeve and said pole pieces are fixedly positioned relative to said shell and said magnetic sensing means, for concentrating the magnetic field developed at said magnetic sensing means by current in the conductor whereby said magnetic sensing means actuate in response to current in the conductor at or above a second predetermined level lower than said first predetermined level.

6. A magnetic flux concentrating attachment for a fault indicator as defined in claim 5 wherein the magnetic sensing means and said projecting ends of said pole pieces lie in a plane generally perpendicular to the axis of the projecting insulating layer of the test point terminal.

* * * * *